United States Patent
Tran

(10) Patent No.: US 6,791,867 B2
(45) Date of Patent: Sep. 14, 2004

(54) SELECTION OF MEMORY CELLS IN DATA STORAGE DEVICES

(75) Inventor: Lung T. Tran, Saratoga, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/299,542

(22) Filed: Nov. 18, 2002

(65) Prior Publication Data

US 2004/0095802 A1 May 20, 2004

(51) Int. Cl.[7] .......................... G11C 11/00; G11C 8/02; G11C 7/00
(52) U.S. Cl. .................. 365/158; 365/232; 365/189.01
(58) Field of Search ................................ 365/158, 201, 365/232, 225.5, 189.01

(56) References Cited

U.S. PATENT DOCUMENTS

| 5,481,493 | A | | 1/1996 | Bergemont |
| 5,801,994 | A | | 9/1998 | Chang et al. |
| 5,909,392 | A | | 6/1999 | Chang et al. |
| 6,490,217 | B1 | * | 12/2002 | DeBrosse et al. ........ 365/225.5 |
| 2002/0105827 | A1 | * | 8/2002 | Redon et al. ............... 365/173 |

* cited by examiner

Primary Examiner—Thong Le

(57) ABSTRACT

A data storage device includes a plurality of shunt elements having controlled current paths connected in series, and a plurality of memory cells having programmable resistance states. Each memory cell is connected across the controlled current path of a corresponding shunt element.

21 Claims, 7 Drawing Sheets

SELECTION OF MEMORY CELLS IN DATA STORAGE DEVICES

BACKGROUND

Magnetic Random Access Memory ("MRAM") is a non-volatile memory that is being considered as a replacement for Flash memory. MRAM has lower power consumption than Flash memory, it can perform write operations much faster than Flash memory, and it is more scalable than Flash memory.

An efficient and dense layout of MRAM memory cells is desirable. Improving efficiency and increasing density can increase memory capacity and lower the cost of MRAM devices. One area for improvement lies in circuitry for selecting memory cells during read and write operations.

SUMMARY

According to one aspect of the present invention, a data storage device includes a plurality of shunt elements having controlled current paths connected in series, and a plurality of memory cells having programmable resistance states. Each memory cell is connected across the controlled current path of a corresponding shunt element.

Other aspects and advantages of the present invention will become apparent from the following detailed description, taken in conjunction with the accompanying drawings, illustrating by way of example the principles of the invention.

DETAILED DESCRIPTION

Figure 1:
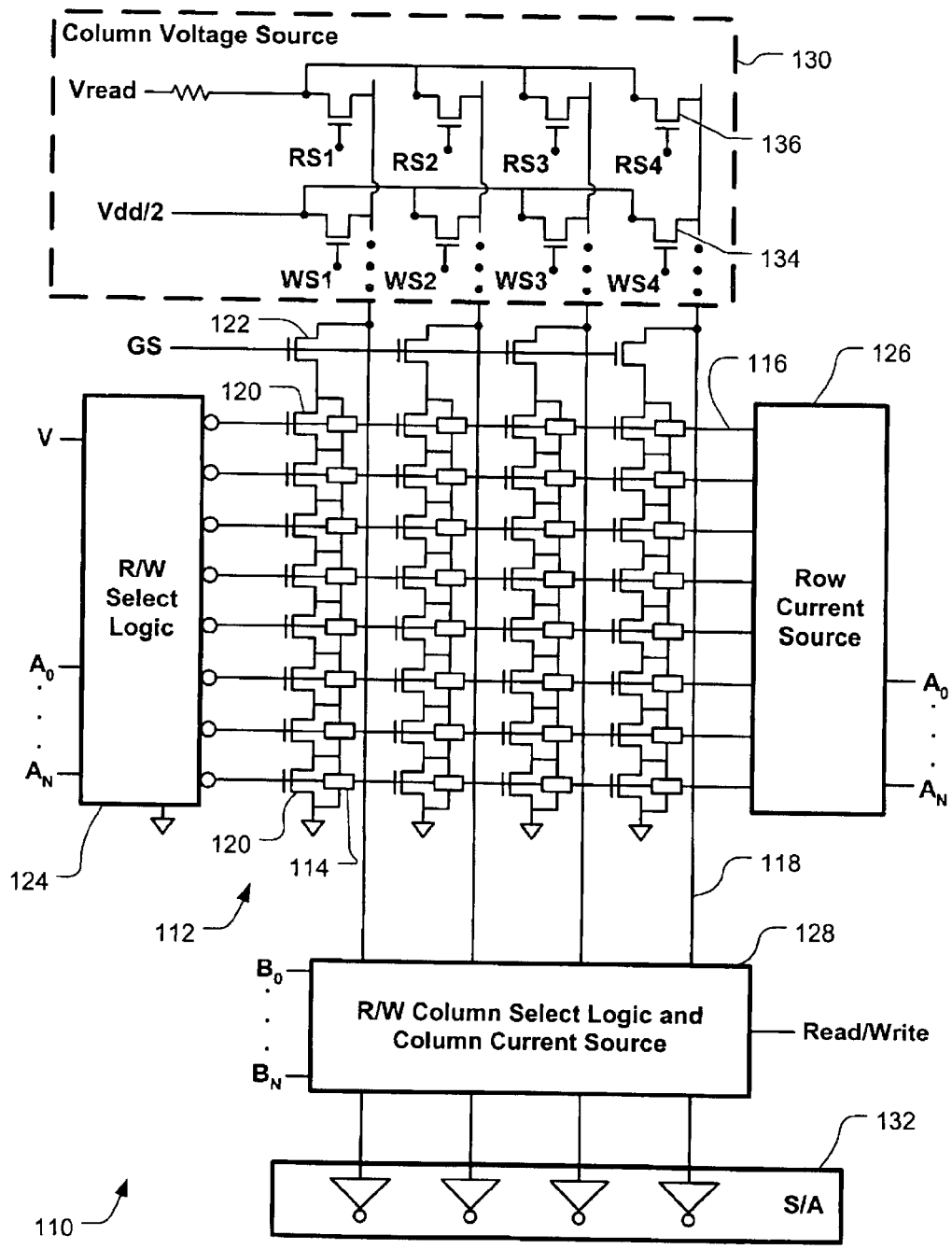
FIG. 1 is an illustration of a first data storage device according to an embodiment of the present invention.

Referring to FIG. 1, a first data storage device 110 includes an array 112 of memory cells 114, word lines 116 extending along rows of the memory cells 114, and bit lines 118 extending along columns of the memory cells 114. Each memory cell 114 is located at a cross point of a word line 116 and a bit line 118.

Each memory cell 114 may include at least one magnetic tunnel junction. An exemplary magnetic tunnel junction includes a reference layer, a data layer and an insulating tunnel barrier sandwiched between the data and reference layers. When the magnetizations of the reference and data layers are in the same direction, the orientation of the magnetic tunnel junction is said to be "parallel." When the magnetizations of the reference and data layers are in opposite directions, the orientation of the magnetic tunnel junction is said to be "anti-parallel." Resistance of the magnetic tunnel junction is a function of the relative orientations of the magnetic tunnel junction. The magnetic tunnel junction has a first resistance state ($R_N$) when the magnetization orientation is parallel, and a second resistance state ($R_N+\Delta R$) when the magnetization orientation is anti-parallel.

The first data storage device 110 further includes a read/write (R/W) circuit for applying write currents to the word and bit lines 116 and 118 crossing selected memory cells 114 during write operations, and for sensing the resistances states of selected memory cells 114 during read operations. The R/W circuit includes a plurality of shunt FETs 120. In each column, drain-source paths of the shunt FETs 120 are connected in series. The drain-source path of each shunt FET 120 is also connected in shunt across a corresponding memory cell 114.

When a shunt FET 120 is turned on, its drain-source resistance ($R_{ON}$) is substantially (orders of magnitude) less than the resistance of the magnetic tunnel junction in its corresponding memory cell 114. Thus $R_{ON}<<R_N<(R_N+\Delta R)$. When a shunt FET 120 is turned off, its drain-source resistance ($R_{OFF}$) is substantially (orders of magnitude) greater than the resistance of the magnetic tunnel junction in its corresponding memory cell. Thus $R_{OFF}>>(R_N+\Delta R)>R_N$.

The word lines 116 are connected to gates of the shunt FETs 120. Each word line 116 is connected to a row of shunt FET gates.

The R/W circuit further includes a plurality of "group select" FETs 122. Each group select FET 122 has a drain-source path that connects a branch of series-connected path to its corresponding bit line 118. A group select signal (GS) is supplied to gates of the group select FETs 122.

The R/W circuit further includes R/W row select logic 124, a row current source 126, R/W column select logic and column current source 128, a column voltage source 130, and sense amplifiers 132. The column voltage source 130 includes write select FETs 134 and read select FETS 136. The drain-source path of each write select FET 134 is connected between a corresponding bit line 118 and a supply voltage (Vdd/2) source. The gates of the write select FETs 134 are supplied with write select signals (WS1–WS4). The drain-source path of each read select FET 136 is connected between a corresponding bit line 118 and a read voltage (Vread) source. The gates of the read select FETs 136 are supplied with read select signals (RS1–RS4).

Figure 2A:
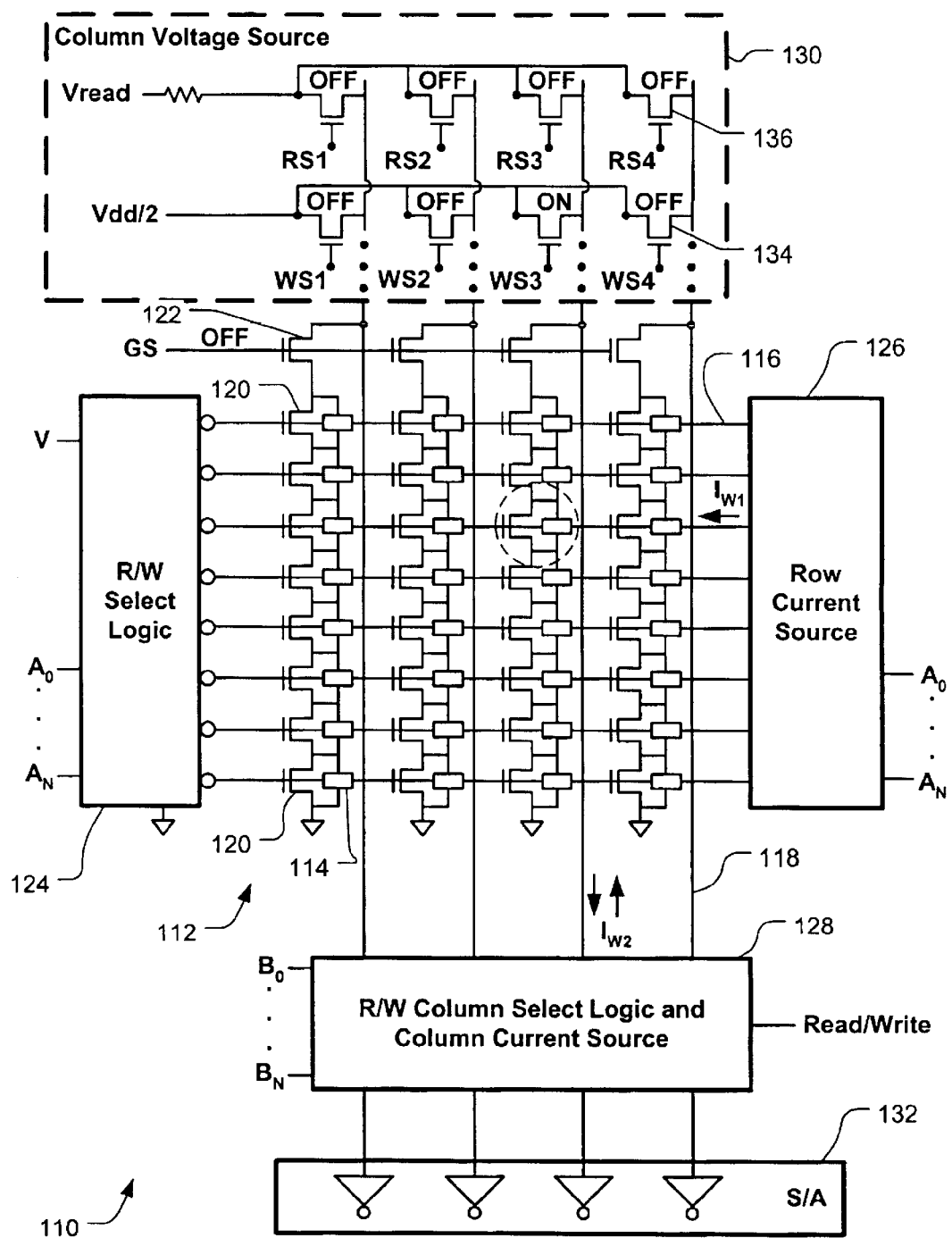
FIGS. 2a and 2b are illustrations of the first data storage device during write and read operations.

Reference is now made to FIG. 2a, which illustrates the on-off states of the FETS 120, 122, 134 and 136 during a write operation on a selected memory cell 114 (the selected memory cell 114 is circled). The group select FETs 122 are turned off to prevent write currents from flowing though the memory cells 114. The RAN row select logic 124 and the row current source 126 decode an address ($A_0 \ldots A_N$) and cause a first write current ($I_{W1}$) to flow through a word line 116 crossing the selected memory cell 114. The read select signals (RS1–RS4) turn off the read select FETs 136. The write select signals (WS1, WS2 and WS4) turn off the write select FETs 134 connected to bit lines 118 that do not cross the selected memory cell 114. The write select signal (WS3) turns on the write select FET 134 connected to the bit line 118 crossing the selected memory cell 114. This allows the R/W column select logic and column current source 128 to supply a second write current ($I_{W2}$) to the bit line 118 crossing the selected memory cell 114. These two write currents ($I_{W1}$ and $I_{W2}$) create magnetic fields that, when combined, orient the magnetization of the data layer of the selected magnetic tunnel junction in a desired direction. A logic [1] or a logic [0] is written by setting the direction of the second write current ($I_{W2}$).

Figure 2B:
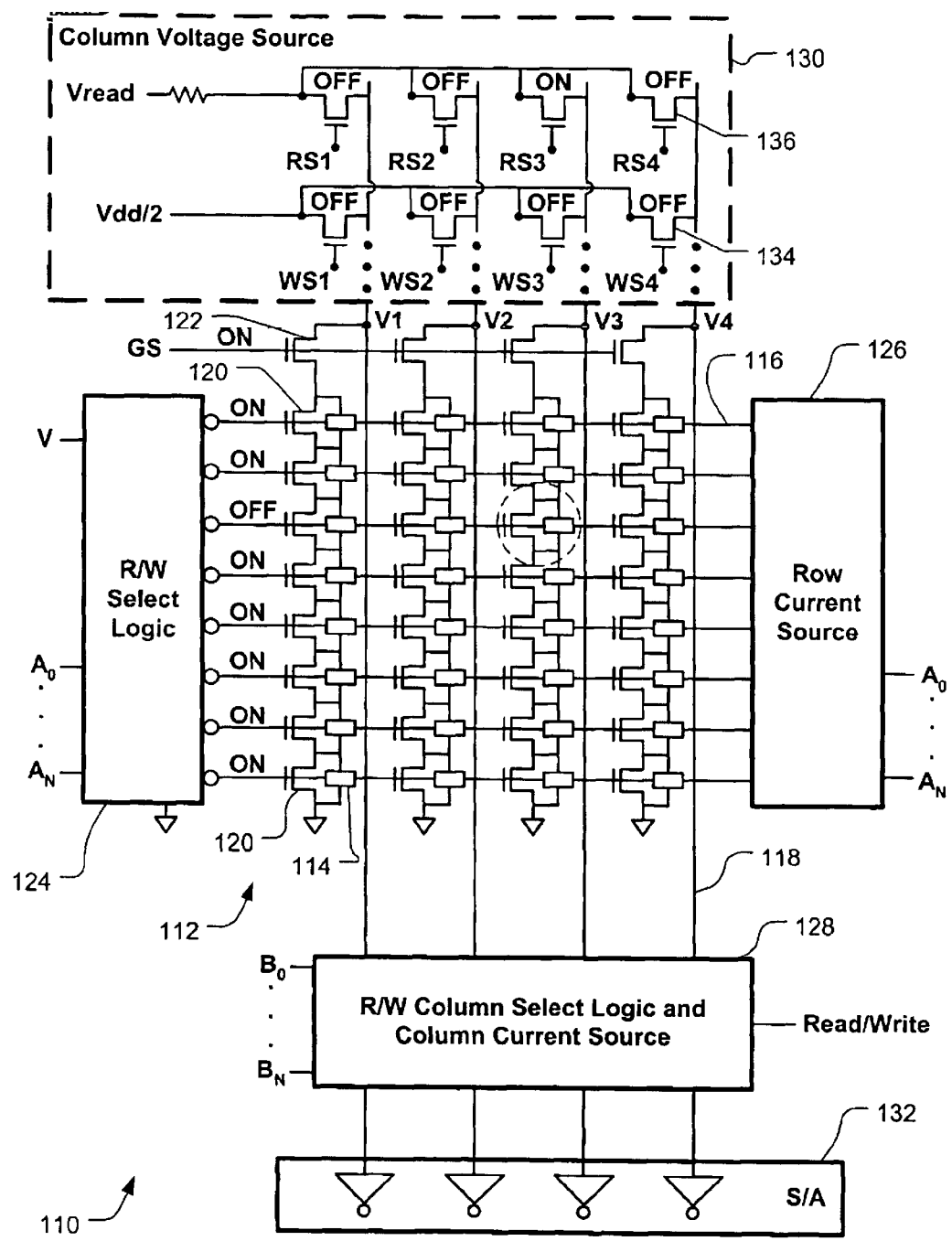

Reference is now made to FIG. 2b, which illustrates the states of the FETS 120, 122, 134 and 136 during a read operation on a selected memory cell 114 (the selected memory cell 114 is circled). The row and column current sources 126 and 128 do not supply write currents to the word and bit lines 116 and 118 during the read operation. The group select FETs 122 are turned on to allow a read current to flow through the selected memory cell 114. The write select signals (WS1–WS4) turn off the write select FETs 134. The read select signals (RS1, RS2 and RS4) turn off the read select FETs 136 connected to bit lines 118 that do not cross the selected memory cell 114. The read select signal (RS3) turns on the read select FET 136 connected to the bit line 118 crossing the selected memory cell 114. The R/W row select logic 124 decodes an address ($A_0 \ldots A_N$) and turns off the shunt FETs 120 connected to the word line 116 that crosses the selected memory cell 114. The R/W row select logic 124 turns on the shunt FETs 120 connected to the word lines 116 that do not cross the selected memory cell 114. As a result, the read voltage (Vread) is applied to the selected bit line 118 via a resistor and a read select FET 136. A read current flows from the bit line 118, and through the series-connected source-drain paths of the shunt FETs 120, until reaching the selected memory cell 114. Since the shunt FET 120 connected across the selected memory cell 114 is off, the read current flows through the selected memory cell 114. The read current then continues to flow through the remaining series-connected drain-source paths of the shunt FETs 120 and to a ground potential. Thus the shunt FETs 120 shunt the read current past unselected memory cells 114.

A sense amplifier 132 senses the voltage V3 on the bit line 118 to determine the resistance state and, therefore, logic value of the selected memory cell 114. Since $R_{ON} \ll R_N$, the voltage drop across the shunt FETs 120 will be relatively low relative to the voltage drop across the selected memory cell 114.

Figure 3:
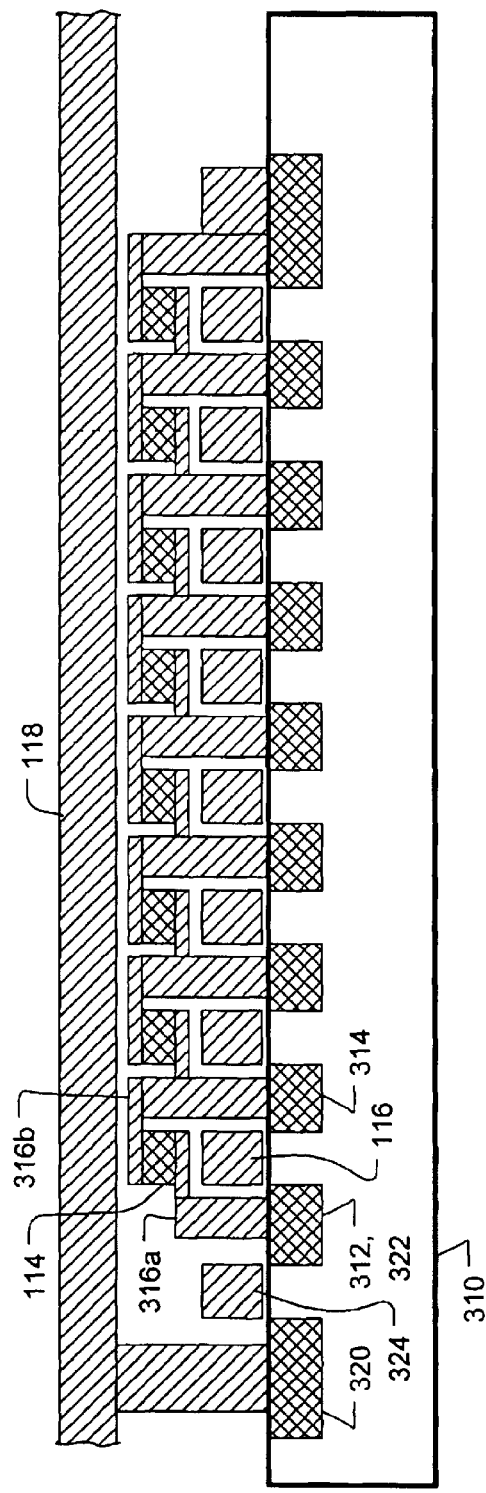
FIG. 3 is an illustration of an exemplary layout for the first data storage device.

Reference is now made to FIG. 3, which shows an exemplary layout for a column of the first data storage device 110. A column of shunt FETs 120 is formed in a substrate 310. Each shunt FET 120 has a drain 312 and a source 314. Adjacent shunt FETs 120 share a drain 312 or source 314.

The word lines 116 also function as gates for the shunt FETs 120. Thus each word line 116 functions as gates for a row of shunt FETs 120.

A column of magnetic tunnel junctions 114 is formed above the word lines 116, but the magnetic tunnel junctions 114 are electrically insulated from the word lines 116 by dielectric. Each magnetic tunnel junction 114 is connected between the drain 312 and source 314 of its corresponding shunt FET 120 by conductors 316a and 316b. Thus the drain-source paths (i.e., controlled current paths) of the shunt FETs 120 are connected in series, and each magnetic tunnel junction 114 is connected across the drain-source path of a corresponding shunt FET 120.

A bit line 118 crosses over the column of magnetic tunnel junctions 114. Dielectric electrically isolates the bit line 118 from the magnetic tunnel junctions 114.

A group select FET 122 includes a source 320, drain 322 and a gate 324. The drain-source path of the group select FET 122 is coupled between the bit line 118 and the drain-source path of the first shunt FET 120. The group select FET 122 may share the same drain 322 as the first shunt FET 120.

Write currents are typically larger in magnitude than read currents. Because the word and bit lines 116 and 118 are separate from the conductors 316a and 316b, the word and bit line may 116 and 118 have a larger cross-sectional area than the conductors 316a and 316b. Reducing the size of the conductors 316a and 316b allows the word and bit lines 116 and 118 to be moved closer to the magnetic tunnel junctions 114.

The present invention is not limited to memory cells based on magnetic tunnel junctions. The memory cells may be based on other types of magnetoresistive memory elements.

The present invention is not even limited to magnetoresistive memory elements. For example, the memory cells could include phase-change elements. The phase-change elements include a material (e.g., InSe) that could be programmed to either an amorphous state or a crystalline state. The phase-change material could have a higher resistance when amorphous than when crystalline. The difference in resistance states can be several orders of magnitude, which gives a good signal to noise and could allow for multiple bits per cell. The resistance of the phase-change material, when crystalline, is orders of magnitude higher than the on-resistance of the shunt FETs.

Figure 4:
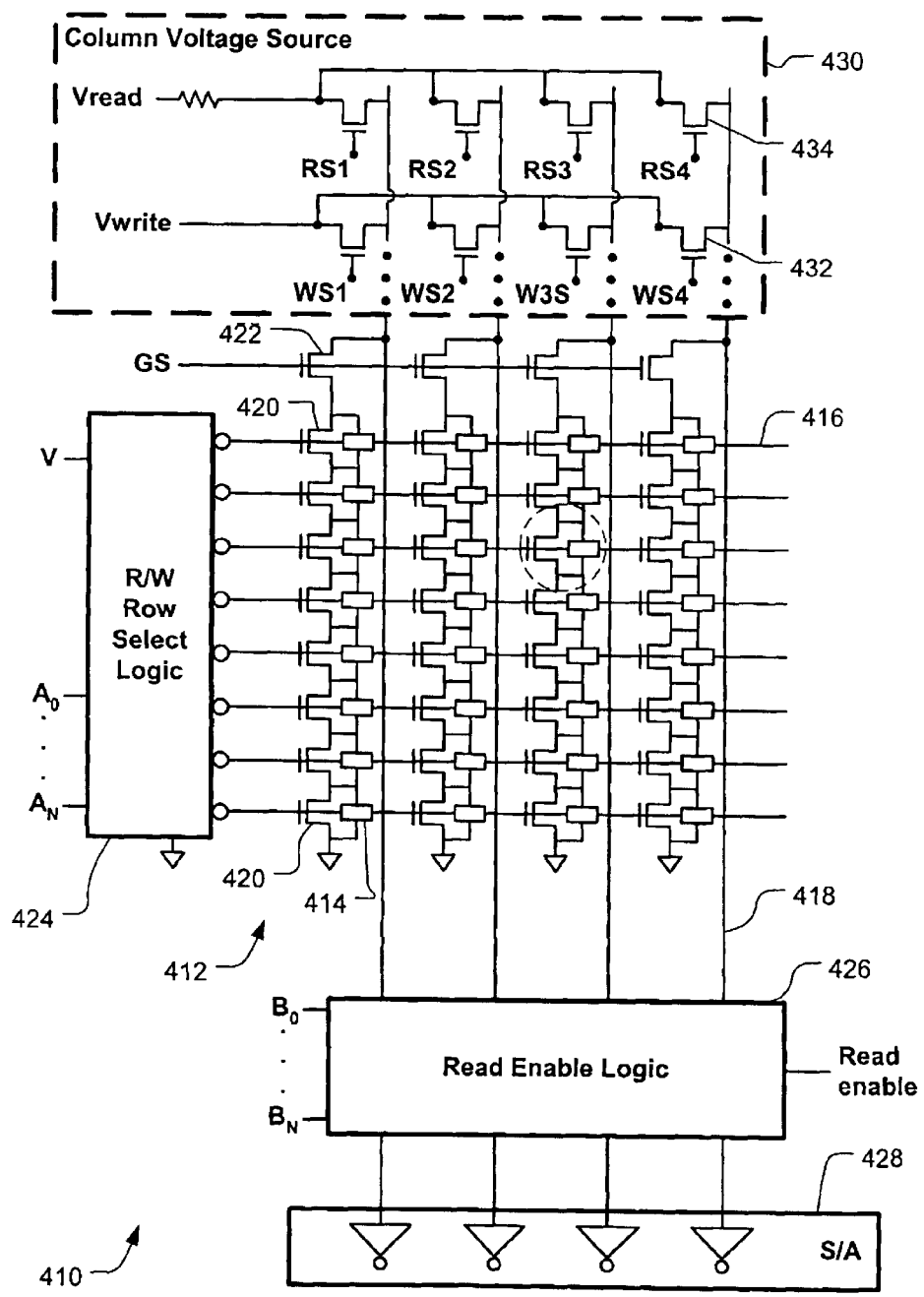
FIG. 4 is an illustration of a second data storage device according to an embodiment of the present invention.

Reference is now made to FIG. 4, which shows a second data storage device 410. The second data storage device 410 includes an array 412 of memory cells 414. The memory cells 414 include phase-change elements.

The second data storage device 410 further includes word and bit lines 416 and 418, a plurality of shunt FETs 420, and a plurality of group select FETs 422. The controlled current path of each shunt FET 420 is connected across a corresponding memory cell 414. A group select FET 422 connects a branch of series-connected drain source paths to a bit line 418. Each word line 416 is connected to a row of shunt FET gates.

R/W row select logic 424 sends on/off signals to the gates of the shunt FETs 420. Read enable logic 426 includes switches for connecting a sense amplifier 428 to a bit line 418 crossing a selected memory cell 414.

A column voltage source 430 provides a voltage pulse or pulses to a selected memory cell 414 during write operations. Applying at least one high amplitude, narrow pulse to the selected memory cell heats and rapidly quenches its phase-change material. As a result, the phase-change material of the selected memory cell 414 becomes amorphous. Applying a longer, medium amplitude pulse to the selected memory cell 414 anneals its phase-change material. As a result, the phase-change material of the selected memory cell 414 becomes crystalline.

The column voltage source 430 includes write select FETs 432 and read select FETS 434. The drain-source path of each write select FET 432 is connected between a corresponding bit line 418 and a write voltage pulse (Vwrite) source. The gates of the write select FETs 432 are supplied with write select signals (WS1–WS4). The drain-source path of each read select FET 434 is connected between a corresponding bit line 118 and a read voltage (Vread) source. The gates of the read select FETs 434 are supplied with read select signals (RS1–RS4). Amplitude of the write voltage pulse (Vwrite) is greater than amplitude of the read voltage (Vread). The amplitude of the read voltage (Vread) should not cause a phase change during read operations on selected memory cells 414.

Figure 5A:
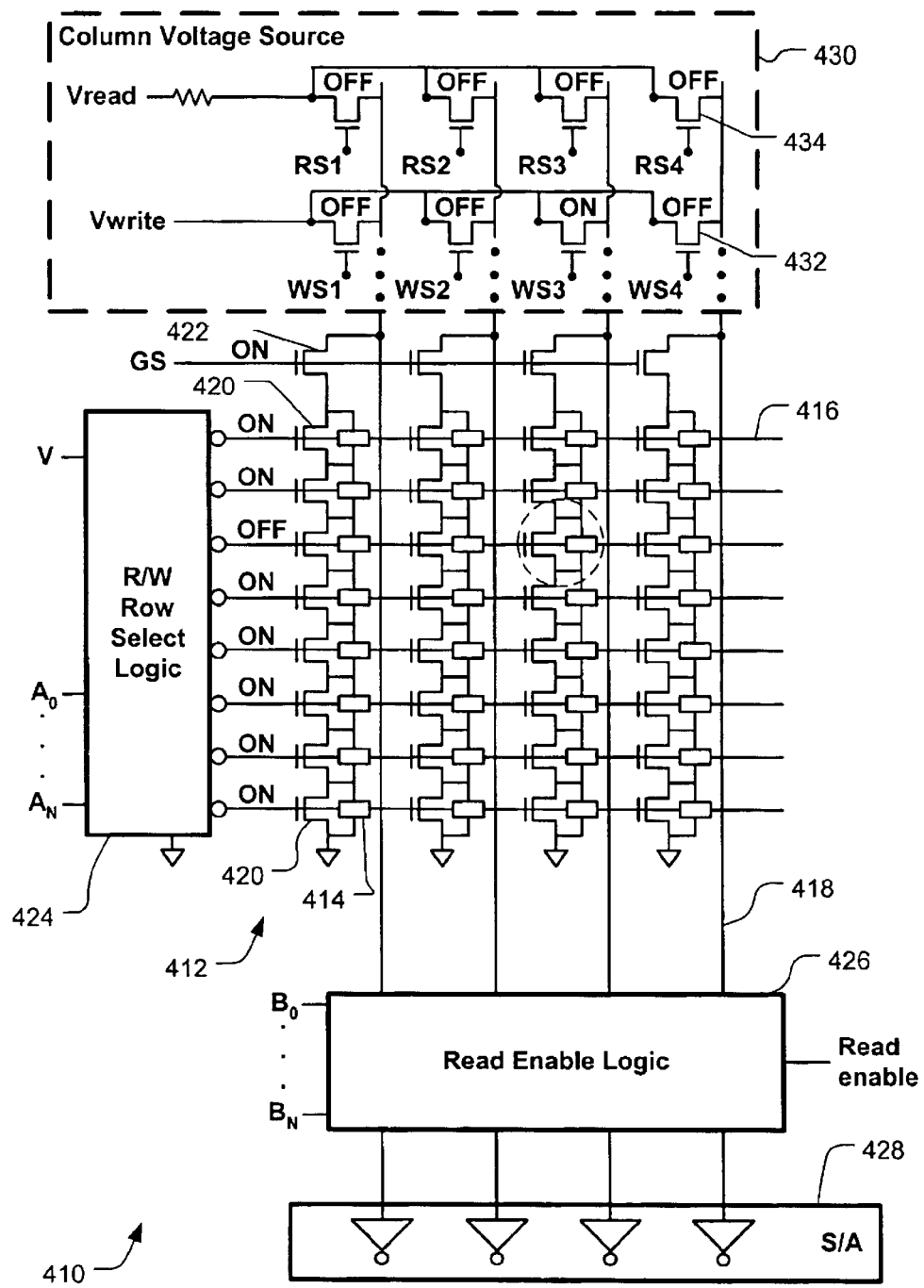
FIGS. 5a and 5b are illustrations of the second data storage device during write and read operations.

Reference is now made to FIG. 5a, which illustrates the states of the FETS 420, 422, 432 and 434 during a write operation on a selected memory cell 114 (the selected memory cell 414 is circled). The group select FETs 422 are turned on, and the read enable logic 426 disconnects all bits lines 418 from the sense amplifiers 428. The R/W row select logic 424 decodes an address ($A_0 \ldots A_N$) and turns on all of the shunt FETs 420, except for the shunt FET 420 connected to the word line 416 crossing the selected memory cell 414. The read select signals (RS1–RS4) turn off the read select FETs 434. The write select signals (WS1, WS2 and WS4) turn off the write select FETs 432 connected to bit lines 118 that do not cross the selected memory cell 114. The write select signal (WS3) turns on the write select FET 134 connected to the bit line 118 crossing the selected memory cell 114. A write voltage pulse (Vwrite) is sent to the selected memory cell 414 via the write select FET 134 that is on. Amplitude and width of the resulting pulse are controlled to set the phase-change element to a desired state.

Figure 5B:
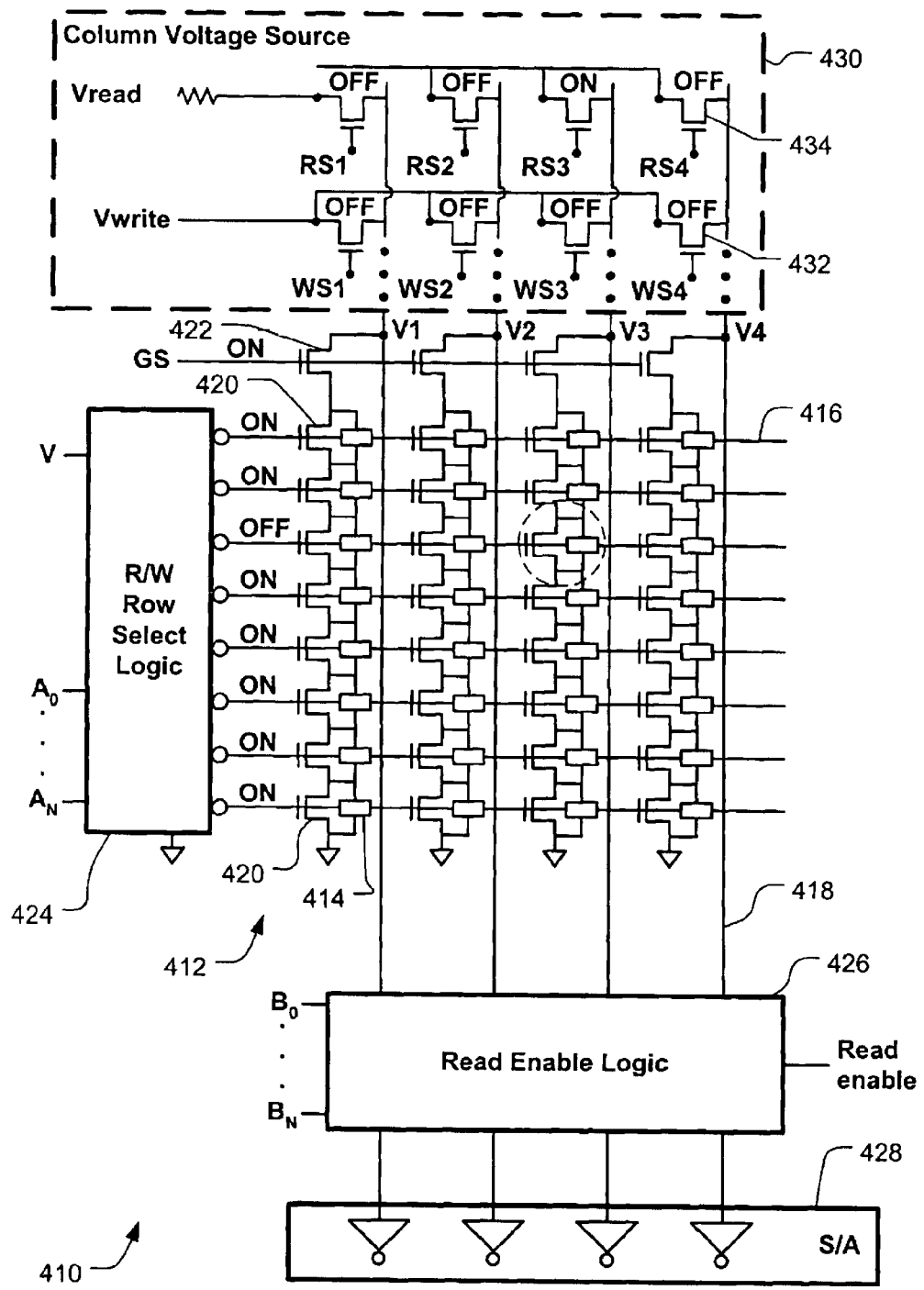

Reference is now made to FIG. 5b, which illustrates the states of the FETS 420, 422, 432 and 434 during a read operation on a selected memory cell 114 (the selected memory cell 414 is circled). The group select FETs 422 are turned on, and the read enable logic 426 decodes an address ($B_0 \ldots B_N$) and connects a sense amplifier 428 to the bit line crossing the selected memory cell 414. The R/W row select logic 424 decodes an address ($A_0 \ldots A_N$) turns on all of the shunt FETs 420, except for the shunt FET 420 connected to the word line 416 crossing the selected memory cell 414. The write select signals (WS1–WS4) turn off the write select FETs 432. The read select signals (RS1, RS2 and RS4) turn off the read select FETs 434 connected to the bit lines 418 that do not cross the selected memory cell 414.

The read select signal (RS3) turns on the read select FET 434 connected to the bit line 418 crossing the selected memory cell 414. As a result, the read voltage (Vread) is applied to the selected memory cell 414 via a resistor and a read select FET 434. The sense amplifier 428 senses the voltage (V3) to determine the state of the phase-change element and, therefore, the logic value of the selected memory cell 414.

The layout for a column of the second data storage device 410 may be similar to the layout shown in FIG. 3 for the first data storage device 110. However, the word and bit lines 416 and 418 of the second data storage device 410 may be thinner and the conductors (connecting the phase-change elements to the sources and drains) of the second data storage device 410 may be made thicker to handle the write pulses.

FIGS. 1, 2a, 2b, 4, 5a and 5b shows a single array of memory elements. However, the data storage devices 110 and 410 are not limited to a single array. For example, a data storage device can include multiple arrays. Sense amplifiers can be shared by more than one array. The group select FETs may be used to select the arrays during read operations.

The present invention is not limited to the specific embodiments described and illustrated above. Instead, the present invention is construed according to the claims that follow.

What is claimed is:

1. A data storage device comprising:
   a plurality of shunt elements having controlled current paths connected in series; and
   a plurality of memory cells having programmable resistance states, each memory cell connected across the controlled current path of a corresponding shunt element.

2. The device of claim 1, wherein the memory cells have a substantially higher resistance than on-resistance of the shunt elements, and a substantially lower resistance than off-resistance of the shunt elements.

3. The device of claim 1, further comprising a plurality of bit lines; the shunt elements forming a plurality of branches of series-connected controlled current paths, each branch connected to a bit line.

4. The device of claim 1, further comprising a plurality of word lines, each word line controlling a row of shunt elements.

5. The device of claim 1, further comprising a plurality of word and bit lines, each memory cell located at a cross point of one of the word lines and one of the bit lines.

6. The device of claim 1, wherein the memory cells include phase-change memory elements.

7. The device of claim 6, further comprising means for applying read voltages and write voltage pulses to selected ones of the memory cells during read and write operations.

8. The device of claim 1, wherein the memory cells include magnetic tunnel junctions.

9. The device of claim 8, further comprising means for applying magnetic switching fields to selected ones of the memory cells during write operations, and read voltages to selected ones of the memory cells during read operations.

10. The device of claim 1, wherein the shunt elements are FETs, each FET having a drain-source path connected across a corresponding memory cell, the device further comprising a circuit for controlling the FETs during read operations, the circuit controlling the FETs by turning on the FETs connected across unselected memory cells, and turning off the FETS connected across selected memory cells.

11. A data storage device comprising:
    a substrate;
    a group of FETs in the substrate, adjacent FETs sharing a drain or source;
    a first set of conductors functioning as gates of the FETs;
    a group of memory elements having programmable resistance states; and
    a second set of conductors connecting each memory element across a source and drain of a corresponding FET.

12. The device of claim 11, further comprising a third set of conductors; the FETs forming a plurality of columns of series-connected drain-source paths, each column coupled to one of the conductors of the third set.

13. The device of claim 12, wherein each memory element is at a cross point of one of the conductors in the first set and one of the conductors in the third set.

14. The device of claim 12, further a second group of FETs, each FET of the second group connecting one of the columns to a corresponding one of the conductors of the third set.

15. The device of claim 11, wherein the memory elements have a substantially higher resistance than on-resistance of the FETs, but a substantially lower resistance than off-resistance of the FETs.

16. The device of claim 11, further comprising logic, connected to the first set of conductors, for turning on FETs connected across unselected memory elements during read operations and for turning off FETs connected across selected memory elements during read operations.

17. A column of a data storage device, the column comprising
    a plurality of memory cells connected in series, each memory cell having at least two programmable resistance states; and
    means for supplying a signal to an input of the series-connected cells during read operations, and shunting the signal across the memory cells that are not selected during the read operations.

18. The column of claim 17, wherein the memory cells include phase-change elements.

19. The column of claim 17, wherein the memory cells include magnetic tunnel junctions.

20. A method of performing a read operation on a group of series-connected data storage elements, each element having at least two programmable resistance states, the method comprising:
    supplying a signal to an input of the group; and
    shunting the signal across the elements that are not selected.

21. The method of claim 20, further comprising determining a voltage drop across the element that is selected; whereby the voltage drop indicates a resistance state of the selected element.

* * * * *